United States Patent [19]

Shreve

[11] Patent Number: 4,542,367

[45] Date of Patent: Sep. 17, 1985

[54] OPTICAL DIGITAL TO ANALOG CONVERTER

[75] Inventor: James S. Shreve, Fairfax, Va.

[73] Assignee: The United States of America as represented by the Secretary of the Army, Washington, D.C.

[21] Appl. No.: 378,677

[22] Filed: May 17, 1982

[51] Int. Cl.[4] .................... H03K 13/02; H03K 13/05
[52] U.S. Cl. ................ 340/347 DA; 364/827; 455/608; 455/615
[58] Field of Search ............... 340/347 M, 347 DA; 370/23, 20; 364/827; 455/608-615; 350/333

[56] References Cited

U.S. PATENT DOCUMENTS

| | | | |
|---|---|---|---|
| 3,407,301 | 10/1968 | Kovanic | 340/347 P X |
| 3,821,481 | 6/1974 | Melvin | 370/20 X |
| 3,892,468 | 7/1975 | Duguay | 350/169 X |
| 4,205,339 | 5/1980 | Howe | 370/20 |

Primary Examiner—T. J. Sloyan
Attorney, Agent, or Firm—Saul Elbaum; Thomas McDonald; Anthony T. Lane

[57] ABSTRACT

Method and apparatus for conversion of digital multistate signals, representing a numerical value, to an optical output signal having an amplitude analogous to the numerical value. A controllable density optical transmission device provides plural optical signals representative of the digital states of components of the input signal. The plural optical signals are weighted and summed by optical filters to provide the desired analogous optical output representing the input numerical value. The use of phase shifting filters enables the conversion of negative and complex numbers. A two dimensional liquid crystal array may be used as the controllable optical transmission device to enable conversion of a plurality of numerical values simultaneously.

17 Claims, 4 Drawing Figures

OPTICAL DIGITAL TO ANALOG CONVERTER

RIGHTS OF THE GOVERNMENT

The invention described herein may be manufactured, used, and licensed by or for the United States Government for governmental purposes without the payment to me of any royalty thereon.

BACKGROUND OF THE INVENTION

This invention relates to digital-to-analog converters, and more specifically to optical digital-to-analog converters wherein an input signal is presented digitally, as a number of discrete multistate signals weighted by various powers of a radix, and converted to an output optical signal having an intensity, or amplitude, analogously determined by the number represented by the weighted input signals.

A digital-to-analog optical recorder is described in U.S. Pat. No. 4,257,111 to Soohoo. This patent discloses an apparatus for modulating a light source, in response to an electronic digital input word, for producing a continuum of output optical levels in which weighting and summing of the data bits is accomplished electronically. Such an apparatus is complex, and thus expensive to produce.

Several optical structures of interest are disclosed in U.S. Pat. Nos. 4,073,010; 4,071,907; 4,110,004 and 4,150,360. These patents generally provide optical systems in which various spatial filters are used to affect transmitted light. In U.S. Pat. No. 4,073,010 an electron beam addressed light valve produces a deposited charge pattern on a target, and a lens is used to obtain the fourier transform of the target image. A similar arrangement is provided in U.S. Pat. No. 4,071,907, where image information is detected by a linear array and fed to a switching network. The latter provides the signals from the array to a control electrode of an electronically addressed light modulator (EALM). Coherent light illuminates the charge pattern on a target of the EALM, and fourier transformation is obtained at a specific plane.

In U.S. Pat. No. 4,110,004, a complex spatial filter is shown in FIG. 9, in which an object transparency is at an input plane P1 and is illuminated by a collimated beam of light provided by a laser and a beam expander. U.S. Pat. No. 4,150,360 provides a two dimensional angular fourier transform spectrum of a transparent image.

Additional background art may be found in U.S. Pat. No. 3,512,871 in which diffracting cells are used in a fourier optics system, and U.S. Pat. No. 4,225,938 which teaches away from the use of a two-dimensional light valve in an optical processing system.

None of the known art, however, either discloses or suggests the use of an optical system to weight and sum the values associated with various bits of a digital data word, and specifically the use of such a system in conjunction with multistate optical gates controlled by the states of the discrete states of the input digital data word, to provide an output optical signal having an intensity which is analogous to the value of the input data.

SUMMARY AND OBJECTS OF THE INVENTION

It is accordingly an object of the present invention to provide a simplified, inexpensive optical converter for providing optical signals analogous to the value of a digitally expressed data word.

It is a more specific object of the invention to provide an optical digital-to-analog converter in which a plurality of multiple-state optical devices are driven by a digital input word, each optical device attaining a state directly determined by the value of a digit in the input word.

It is still a more specific object of the invention to use a plurality of binary, on-off, optical devices in a digital-to-analog converter for data words expressed as a plurality of binary digits.

It is another object of the invention to provide an optical digital-to-analogue converter capable of representing optically any number, whether positive or negative, whether real or complex.

It is yet another object of the invention to provide a digital-to-analog converter in which the states of the input digits are weighted and summed optically.

Still another object of the invention is the provision of an optical filter in a fourier transform relationship with an optical array having a plurality of individual elements, each of which is provided with an optical transmittance determined by a particular bit of an input digital data word, for weighting and summing the various transmittance values to provide an output optical signal having an amplitude and phase analogous to the value of the input digital data word.

It is still another object of the invention to provide an optical digital-to-analog converter in which a phase shifting device is used in conjunction with an optical array of individual elements to provide appropriate phasing to optical radiation transmitted therethrough, thereby to represent positive, negative, real or imaginary components of an input digital data word.

Still a further object of the invention is the use of a single device to provide phase shifting and weighting of optical signals in an optical digital-to-analog converter.

Yet another object of the invention is the provision of an optical digital-to-analog converter including structures enabling simultaneous conversion of a plurality of input digital data words to a plurality of output optical signals.

In accordance with the foregoing objects, the present invention includes an optical transmission device having controllable, defined multiple density states. Particular numerical values input to the transmission device cause the transmission therethrough of incident optical radiation as a plurality of optical signals having particular intensities representing the particular numerical values. The plurality of optical signals are received and weighted by an optical weighting means. An optical summing means is used to sum the plurality of weighted optical signals, for producing an output optical signal having an amplitude representative of a combination of the numerical values.

As one aspect of the invention, the optical transmission device, the weighting means and summing means are positioned with respect to a plurality of lenses so as to have a fourier transform relationship. Additionally, a masking means, which provides an aperture defining an output location for the optical signal, is positioned with respect to a further lens to provide a fourier transform relationship between the masking means and the summing means.

In accordance with one feature of the invention, the optical transmission device is formed as an electrically controllable light valve array, including a number of individually controllable, two-state optical devices each outputting a signal representing a particular bit value of the input data word. The array may be formed as a plurality of sets of the two-state devices, each set providing an output signal representing a separate input data word.

In accordance with another feature of the invention, a phase shifting means is provided, adjacent the optical transmission device, for providing appropriate phase shift to the optical signals to represent negative and complex numbers.

In one form of the invention, the phase shifting means and the optical weighting means are combined, and the summing means is formed as a diffraction grating, which replicates and superimposes the weighted outputs of the phase shifting means.

In another form of the invention, the optical summing means and the optical weighting means are combined in a filter. Preferably, the filter is described by a specific density distribution, in which the transmittance, F, is given by $$F = \text{rep}_{1/d}\left[\frac{2\alpha}{\alpha^2 + 4\pi^2 (Xd)^2}\right].$$

In this form of the invention, the optical transmission device and the phase shifting means are located a focal length away from a first lens, for receiving incoming coherent optical radiation. At the opposite side of the lens, also a focal length away, the filter is located. A second lens is located a focal length away from the filter, and a mask, defining the output aperture, is disposed at the opposite side of the second lens, also a focal length away.

The present invention additionally includes a method for converting binary electrical signals to analog optical signals by controlling the controllable density transmission device with the electrical signals, thus permitting a number of optical signals to be produced. Optical radiation is passed through the transmission device to produce the optical signals, which are optically weighted and summed, and directed to an output location defined by the optical mask.

BRIEF DESCRIPTION OF THE DRAWING

The foregoing and other features, objects and advantages of the invention will become more readily apparent from the following specification and appended claims, when considered in conjunction with the drawing in which:

DETAILED DESCRIPTION OF THE PREFERRED EMBODIMENT

Figure 1:
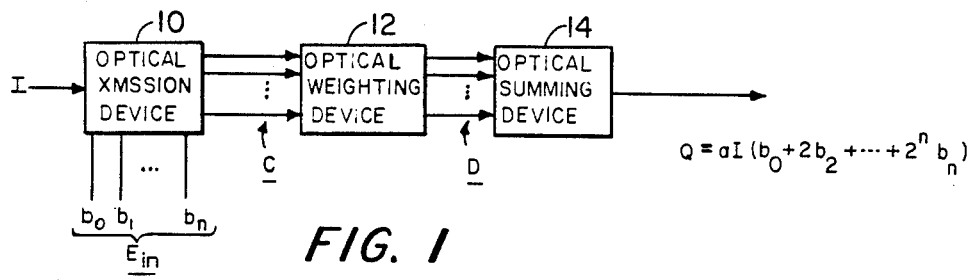
FIG. 1 shows a block diagram illustrating the principles of the present invention.

Referring now to the drawing, FIG. 1 broadly shows, in block diagram form, apparatus for converting an input electrical signal representing a sequence of bits to an output optical signal having an intensity, or amplitude, which represents the number encoded by the input binary electrical signal, due consideration being given to the phase of the output signal. As shown in the figure, the present invention receives an input signal $E_{in}$, represented by a number of binary valued signals $b_0, b_1, b_2, \ldots b_n$. Each of the signals $b_0, \ldots b_n$ may take on a value of 0 or 1 in a binary system. It is to be understood that the present invention is applicable to any discretely specified signals, irrespective of the specific radix used in representing numbers.

A particular input word of n digits represents a specific input number. In the case of binary systems, each of the n input bits is weighted by an appropriate power of the radix 2, and the weighted values added to provide the input number. Where the input word $E_{in}$ represents the input number, it may be written as $$E_{in}=[b_k]^T[2^k],\qquad(1)$$

where $[b_k]^T$ and $[2^k]^T$ are the row vectors $[b_0 \ldots b_k \ldots b_n]$, where $b_k=0, 1$, and $[2^0 \ldots 2^k \ldots 2^n]$, respectively.

While a single input number is represented by the signal shown in FIG. 1, the present invention provides conversion to analog optical signals of any number of simultaneously input numbers, as described in the sequel.

For illustrative purposes, however, the arrangement of FIG. 1 is shown as including an optical transmission device 10 having electrically controllable density distribution. The device 10 is illuminated by coherent optical radiation, preferably provided by a laser and a beam expander. The incident optical irradiation is shown as illuminating the controllable density transmission device with an intensity I, and the electrical signal $E_{in}$ provides a number of separate signals, specifically the signals $[b_k]$, for controlling the device 10.

In accordance with the invention, device 10 outputs a number of individual optical signals, designated by the vector $$C=[c_k]=aI[b_k];\ a=\text{attenuation constant}.$$

That is, several optical signals are outputted by the device, each signal having a predetermined portion of the incident intensity in accordance with a corresponding bit value of the input electrical signal. In order to provide an output optical signal representative of the numerical value of the input signal, however, each of the components of the output vector C, that is, each $c_k$, must be appropriately weighted by the proper power of the system radix, and the weighted components must be added.

Unlike prior art devices, wherein optical devices capable of producing a continuum of optical levels are used and complex equipment is required to provide a specific numerical value, the present invention utilizes optical gates which have a predetermined number of optical density states, corresponding to the system radix. For a binary system, simple "on-off" optical gates are used to provide the output vector components $c_k$. Further, rather than using electronic circuitry to provide signal weighting and summing, which circuitry operates on the input signal $E_{in}$ rather than on the optical signals, the present invention provides optical devices for weighting and summing the optical signals as described herein.

Specifically, an optical weighting device 12 is provided in the path of the output optical vector C. Device 12 thus receives an optical signal C at its input and provides an optical signal D at its output, where $$D = TC = [d_k], \text{ and} \quad (2)$$

$$T = [t_{ij}]$$

is a diagonal transformation matrix, in which $$t_{ij} = 0, \ i \neq j \text{ and}$$

$$t_{kk} = 2^{k-1}, \ k = 1, 2, \ldots n+1.$$

The resulting optical signal represented by the vector D thus includes a number of individual signals, each proportional to the weighted components of the input electrical signal. Specifically, $$[d_k]^T = aI[b_o, 2b_1, 4b_2, \ldots 2^k b_k, \ldots 2^n b_n]. \quad (3)$$

This signal, analogous to the input signal, is a group of weighted components. In order to represent the actual numerical value of the input signal, however, the present invention provides a further optical device, specifically an optical summing device 14 for adding the various components of the vector D.

Mathematically, the transfer function of device 14 may be represented as a unity column vector 1:

$$1^T = [1, 1, \ldots 1]$$

and the output optical signal of summing device 14 is thus seen to have an intensity Q given by $$Q = D^T 1 = aI(b_o + 2b_1 + \ldots + 2^k b_k + \ldots + 2^n b_n). \quad (4)$$

As is seen from the above equation, the present invention provides an output optical signal having an intensity proportional to the numerical value represented by the input electrical digital signal.

An additional component, not shown in FIG. 1, provides appropriate phase shifts for various ones of the vector components $d_k$, so that negative and complex numbers may be converted to analogous optical forms by the present structure. Such phase shifting is needed to convert two's complement encoded signals, for example, in which the most significant bit is a sign bit and wherein the weighted bit values are to be subtracted from unity.

The balance of the disclosure describes specific optical components for performing one or more of the functions required by the structure of FIG. 1 for converting a digital input signal to an optical output signal having an amplitude and phase representative of the numerical value of the input signal.

Figure 2:
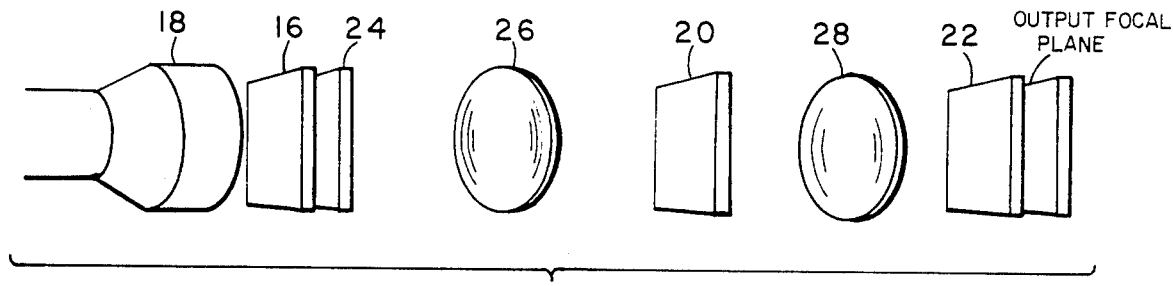
FIG. 2 schematically shows an optical arrangement for carrying out the principles illustrated in FIG. 1.

Referring now to FIG. 2, a digitally controlled attenuator 16, comprised of a two-dimensional array of binary light valves, is used in conjunction with an optical source 18 to provide the output optical vector C. A two-dimensional dot-matrix liquid crystal display may be used for the attenuator 16.

The display includes a plurality of lines, one for each number to be simultaneously processed and converted by the inventive device. Each line includes the appropriate number of cells for a single number, half the cells provided for converting real portions of an input number and half for converting imaginary portions. It is noted that the configuration of FIG. 2 is designed to operate with coherent optical processors wherein an imaginary value is represented by an optical signal which is phase shifted 90° with respect to an arbitrary reference. Similar designs will occur to those skilled in the art for providing signals for operation with other conventions for representation of complex numbers.

Each cell of the liquid-crystal array is electrically controlled to provide complete- or zero-attenuation by an input signal. A converter may be provided to change a plurality of input words to a row-column addressing scheme for the array, so that several input words may be simultaneously or sequentially converted by the present apparatus. It is recognized that even in zero-attenuation states there may be some minimal attenuation by the cells of the matrix. The factor a in the preceeding equations is intended to represent any such residual attenuation.

The following describes the conversion of a single input value, represented by $a + i\ b$, in detail. Other, parallel, inputs are similarly converted.

Referring again to FIG. 2, the apparatus further includes a filter 20. An optical mask 22 may be provided for defining an output aperture. The attenuator 16 and filter 20 are disposed on opposite sides of a lens 26 and are separated therefrom by one focal length. As is known in the art, this arrangement provides a fourier transform relationship between the attenuator and the filter. Optical source 18, comprised of a laser and beam expander, provides a uniform unity-amplitude coherent optical signal to attenuator 16. In order to convert negative and complex numbers, a phase shifting filter 24 is provided. It should be understood that the concepts of the present invention do not require the use of mask 22 or of shifting filter 24. Mask 22 is provided more sharply to define the output aperture, however. Negative and imaginary numbers may be converted by separate channels, and the output combined either electrically or optically. Phase shifting filter 24 is provided for more efficient and compact conversion of input signals in a single channel, whether positive, negative, real or complex.

A second lens 28 is provided, with filter 20 and mask 22 disposed at the focal planes on opposite sides thereof. Thus, the output optical ray has an intensity and phase, Q, described in terms of a fourier transform F as follows:

$$\begin{aligned} Q &= G \cdot F^{-1} [F(P \cdot W) \cdot F] \\ &= G \cdot [(P \cdot W) * F^{-1}(F)] \end{aligned} \quad (5)$$

where:
 P is the spatial transmittance distribution of attenuator 16 along a row (or column) representing a single input number;
 W is the spatial transmittance distribution of filter 24, a phase shifting device;
 F is the spatial transmittance distribution of filter 20; and
 G is the spatial transmittance distribution of mask 22, $F^{-1}$ being the inverse fourier transform and * signifying a convolution operation.

Referring again to Eq. (1), the following modification is made to represent an input number which may be positive, negative, real, or complex, provided with a two's complement notation:

$$E_{in} = [a_k]^T S[2^k] + i[b_k]^T S[2^k] \quad (6)$$

where $a_k$ are the bits representing the real component of the input number, $b_k$ are the bits representing the imaginary component of the input number, and S is a transformation matrix wherein $s_{ij}=0$, $i \neq j$ and $s_{kk}=\text{SGN}(N-\frac{1}{2}-k)$, causing the most significant bit to be assigned a negative value (acting as a minus sign) for negative numbers.

Defining the coefficients $$A_k = \text{rect}(x/d) * \delta[x-(N+1-k)d] \qquad (7)$$

and $$B_k = \text{rect}(x/d) * \delta[x+(N+1-k)d] \qquad (8)$$

where rect(x/d) represents a function equalling 0 everywhere else and 1 in the interval $-d/2$ to $+d/2$, and x is the displacement variable along a row of cells, having a dimension d, representing one number in the two dimensional attenuator array 16, N being the number of bits (including the sign bit) used to represent an input word or number, it is seen that P in equation (5) may be described by:

$$P = [A_k] + [B_k]. \qquad (9)$$

Where the transmittance of each of the cells of width d along the line is controlled by one of the input bits, the optical signal output by attenuator 16 may be described in terms of the modified transmittance. That is, the transmittance of the attenuator becomes $$P = [a_k]^T [A_k] + [b_k]^T [B_k]. \qquad (10)$$

The attenuator thus displays individual cells which are either ON of OFF, as determined by the input bits $a_k$ and $b_k$.

In order to provide appropriate phase shifts to the optical signal output by the attenuator, phase shifting filter 24 is provided with a phase shift described by $$W = S[A_k] + iS[B_k]. \qquad (11)$$

In Eq. (11) S is the transformation matrix described with respect to Eq. (6), and any component of the phase shift matrix W which is $+1$ represents a location on the phase shifting filter having zero phase shift; any $-1$ in W represents a location on the phase shift filter having 180° phase shift; $+i$ represents a location having 90° phase shift, and $-i$ represents a location having 270° phase shift.

Figure 3:
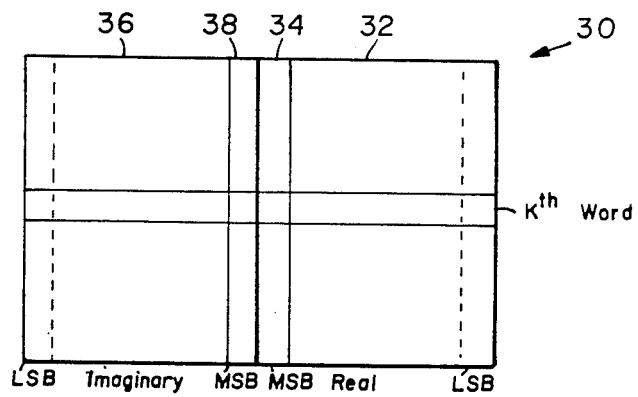
FIG. 3 shows a phase shifting filter for use in the arrangement of FIG. 2.

It should be noted that inasmuch as, for illustrative purposes, the described locations are along the horizontal, or x axis, where specific plural numbers are to be converted, the phase shifting filter includes a vertical dimension. However, the phase shift required is constant for corresponding bit locations for the various numbers. Thus there is provided a phase shifting filter as shown in FIG. 3. The phase shifting filter is shown at 30, and includes a vertical strip 32 sufficiently wide to encompass all the cells of attenuator 16 used to represent the real component of a number.

A vertical strip 34, located for transmitting the output of the cells representing the most significant bit of the real component of the input number, provides 180° phase shift to light passing therethrough. Thus a 1 value in the most significant bit location of the real component is translated to a 180° phase shift for the output light signal representing the most significant bit of the real portion of the output.

A further strip 36 transmits all light signals representing bits of the imaginary component of the number, providing a 90° phase shift thereto. Finally, a strip 38 provides an additional 180° phase shift to the most significant bit in the imaginary component of the output light signal, providing a total phase shift of 270° thereto to represent negative imaginary components.

The attenuator 16 and phase shifting filter 24 are located adjacent one another, thereby providing a combined transmittance as a point-by-point product of the transmittance of each. From Eqns. (10) and (11), it is seen that the factor P·W of Eq. (5) is $$P \cdot W = [a_k]^T S[A_k] + i[b_k]^T S[B_k]. \qquad (12)$$

In accordance with the invention, filter 20 is provided with a transmittance function F given by $$F = \text{rep}_{1/d} \left[ \frac{2\alpha}{\alpha^2 + 4\pi^2 (Xd)^2} \right] \qquad (13)$$

where "rep" is the replication function defined as $$\text{rep}_T u(t) = \sum_{n=-\infty}^{\infty} u(t - nT),$$

$\alpha$ is defined by $\alpha = \log_e 2 = 0.69315$, and

X is the coordinate corresponding to x, but in the fourier transform domain.

The inverse transform of the function F of Eq. (13) is $$f = F^{-1}(F) = d \text{comb}_d 2^{-|x/d|} \qquad (14)$$

where "comb" is the sampling function defined as $$\text{comb}_F U(f) = \sum_{n=-\infty}^{\infty} U(nF) \delta(f - nF). \qquad (15)$$

Thus, $$F^{-1}(F) = d \sum_{k=-\infty}^{\infty} 2^{-|k|} \delta(x - kd). \qquad (16)$$

Substituting Eqns. (12) and (16) into Eq. (5), there results $$Q = G \left[ \left( \sum_{k=0}^{N} s_{kk} a_k A_k + i \sum_{k=0}^{N} s_{kk} b_k B_k \right) * \left( d \sum_{k=-\infty}^{\infty} 2^{-|k|} \delta(x - kd) \right) \right]. \qquad (17)$$

It is noted that the first summation of Eq. (17) involves a convolution of two delta functions, from the terms $A_k$ and from $F^{-1}(F)$, yielding $\delta(x-k_1 d-Nd-d+k_2 d)$, where $k_1$ is the summation index of the inverse fourier transformation and $k_2$ is the summation index used in summing the factors $A_k$.

From defining equations (7) and (8), it is seen that the above result is convolved with rect(x/d). Additionally, mask 22 is provided with an aperture defined by $$G = \text{rect}(x/d). \tag{18}$$

In order for the optical signal to pass through aperture G, the functions rect(x/d) of equations (7) and (8) must coincide with that of equation (18). That is, the rect(x/d) function of Eqs. (7)–(8), as convolved, must not be displaced from the origin. This imposes the condition $$\delta(x - k_1 d - Nd - d + k_2 d) = \delta(x - 0)$$

for Eq. (7), or $$k_1 = (N+1-k_2). \tag{19}$$

Similarly, for Eq. (8), using $k_3$ as the summation index, $$k_1 = (N+1-k_3). \tag{20}$$

The effect of mask 22 can thus be taken into account by writing Eq. (17) as $$Q = \sum_{n=0}^{N} ds_{nn} a_n 2^{-|N+1-n|} \text{rect}(x/d) + i \sum_{n=0}^{N} ds_{nn} b_n 2^{-|N+1-n|} \text{rect}(x/d). \tag{21}$$

This may be rearranged as $$Q = 2^{-(N+1)} d \left[ \sum_{n=0}^{N} s_{nn} a_n 2^n + i \sum_{n=0}^{N} s_{nn} b_n 2^n \right] \text{rect}(x/d) \tag{22}$$

$$= 2^{-(N+1)} d\, \text{rect}(x/d)\, E_{in}$$

upon comparison with Eq. (6).

It is thus seen that, as desired, the output optical signal has an amplitude analogous to the input numerical value over the interval $-d/2 \leq X \leq +d/2$, with the exception of a scaling factor $2^{-(N+1)}d$.

The valid output interval may be elongated by use of lenses of different focal lengths, thereby altering the scaling factor relating physical distances in the optical equipment to values of the variables in the various planes. That is, the fourier transform is taken with one scaling factor, and the inverse transform is taken with another scaling factor.

Figure 4:
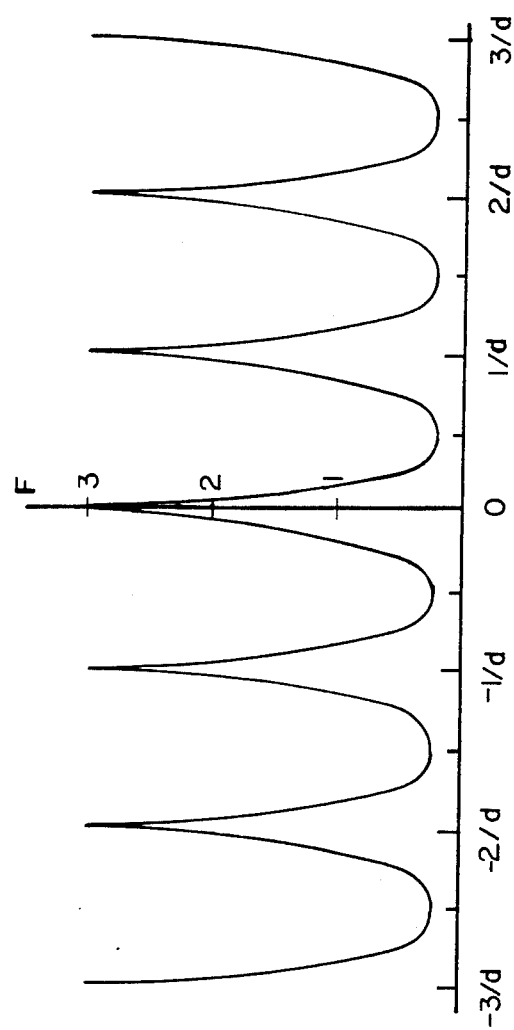
FIG. 4 shows an optical transmittance distribution for a filter used in the arrangement of FIG. 2 for weighting and summing optical signals.

The filter 20 is used for performing two functions in the above described embodiment. As noted from Eqs. (13) and (16), filter 20 is used both to provide the weighting for the optical signals passing through the various cells of the attenuation array, and to replicate the signals, thereby providing a summation of the various signals at any selected aperture. The filter transmittance performing the combined functions is shown in FIG. 4.

As an alternative embodiment, phase shifting filter 30 may provide the weighting as well as the phase shift to the optical signals. Filter 20 thus provides the single function of replicating, or optically summing the signals. This function may be achieved by the use of a diffraction grating, which serves to replicate and superimpose the weighted signals provided by phase shifting filter 30.

For this alternate embodiment, the transmittance of filter 30 is described by $$W^T = [A_k]^T S[2^{k-N}] + i[B_k]^T S[2^{k-N}], \tag{23}$$

where $[2^{k-N}]$ is a diagonal matrix in which the $k^{th}$ element is $2^{k-N}$. The combined transmittance product of attenuator 16 and the filter 30 is given by $$P \cdot W = [a_k]^T S[2^{k-N}][A_k] + i[b_k]^T S[2^{k-N}][B_k]. \tag{24}$$

The filter 20 is replaced by a standard diffraction grating having a transmittance function $$f = \text{rep}_{1/d} \text{rect}(x/r) \tag{25}$$

in which the distance 1/d is the grating line spacing, while r is the width of the clear area between lines. For this case, $$\underline{F}^{-1}(f) = d \cdot r \, \text{comb}_d \, \text{sinc}(xr) \tag{26}$$

$$= d \cdot r \sum_{k=-\infty}^{\infty} \text{sinc}(k \cdot d \cdot r) \delta(x - kd).$$

The contributions of interest arise from limited values of k. It is assumed that for regions of interest $$r << |k \cdot d|^{-1}, \tag{27}$$

in which case the sinc (k.d.r) function can be set at unity, resulting in $$\underline{F}^{-1}(f) \approx d \cdot r \sum_{k=-\infty}^{\infty} \delta(x - kd). \tag{28}$$

From Eqns. (5), (24) and (28) it follows that $$Q \approx G \left[ \left( \sum_{k=0}^{N} s_{kk} a_k 2^{k-N} A_k + i \sum_{k=0}^{N} s_{kk} b_k 2^{k-N} B_k \right) * \left( d \cdot r \sum_{n=-\infty}^{\infty} \delta(x - nd) \right) \right] \tag{29}$$

By carrying out the convolution of the dirac delta functions, and incorporating Eqns. (7)–(8), this may be rewritten as $$Q \approx G \left[ \left( d \cdot 2^{-N} \cdot r \sum_{k=0}^{N} s_{kk} a_k 2^k \sum_{n=-\infty}^{\infty} \text{rect}(x/d) * \delta(x - nd - Nd - d + kd) \right) + i d \cdot 2^{-N} \cdot r \left( \sum_{k=0}^{N} s_{kk} b_k 2^k \sum_{n=-\infty}^{\infty} \text{rect}(x/d) * \delta(x - nd + Nd + d - kd) \right) \right]. \tag{30}$$

Convolution of the rect functions merely displaces the rect function by its own width as n is stepped by an integer. Therefore the rect functions sum to unity everywhere.

Mask 22 serves to block results for large values of k, thereby permitting the approximation (27), but even so might be unity over an interval much larger than d. It thus follows from Eq. (30) that $$Q \approx d \cdot 2^{-N} \cdot r \left( \sum_{k=0}^{N} s_{kk} a_k 2^k + i \sum_{k=0}^{N} s_{kk} b_k 2^k \right) \text{rect}(x/Md) \quad (31)$$

$$= d \cdot 2^{-N} \cdot r[\text{rect}(x/Md)] E_{in}.$$

It is thus seen that the second embodiment provides the desired optical output over an interval approximately M times the interval d, to an approximation which depends on the choice of M and r.

Because of inaccuracies in implementing the cell width d, the grating spacing 1/d and the specific focal lengths of lenses required for the above described embodiment, the preferred embodiment of the invention is the first described embodiment hereof.

There has thus been described a method an apparatus for providing an optical signal for representing a numerical value input thereto as a control signal having a plurality of multi-state components. For electrical signals comprised of a number of digits, operating in binary-state systems, an attenuating array comprised of liquid crystal cells, for example, may be controlled by the bit values of the component digits to provide ON or OFF transmittance values to the cells. the resulting signals are passed through a phase shifting filter, having an absolute value of unity transmittance but providing appropriate phase shifts to enable representation of negative and complex numbers. Additional optical devices are provided for weighting the signals transmitted through the attenuating array and for summing the components, to provide an output optical signal having an intensity representing the input numerical value.

The preceding specification describes, by way of illustration and not of limitation, a preferred embodiment of the invention. I wish it to be understood that I do not desire to be limited to the exact details of construction shown and described, for obvious modifications can be made by a person skilled in the art.

I claim:

1. An optical digital to analog conversion apparatus comprising:
   controllable density optical transmission device having multiple defined density states for transmission of coherent optical radiation therethrough as a plurality of optical signals having particular numerical values inputted thereto;
   optical weighting means, positioned for receiving the plurality of optical signals from said optical transmission device, for providing different optical weights to each of said plurality of signals;
   optical summing means, positioned for summing the plurality of weighted optical signals, for producing an output optical signal having an amplitude representing a combination of said plurality of particular numerical values;
   masking means providing an aperture for defining an output location for said output optical signal; and
   a lens positioned with respect to said masking means and said summing means so that a fourier transform relationship exists therebetween.

2. A method for converting binary electrical signals to analog optical signals comprising the steps of:
   controlling a controllable density optical transmission device with said electrical signals for producing a plurality of optical signals;
   passing coherent optical radiation through said optical transmission device to produce said plurality of optical signals;
   optically weighting and adding predetermined amounts of phase shift to said optical signals produced by said optical transmission device for representing different forms of analog numerical quantities; and
   summing the plurality of weighted and phase shifted optical signals at an output location defined by an optical masking means.

3. Optical digital-to-analog conversion apparatus comprising:
   controllable density optical transmission device having multiple defined density states for transmission of coherent optical radiation therethrough as a plurality of optical signals having particular intensities for representing a plurality of particular numerical values inputted thereto;
   optical weighting means, positioned for receiving the plurality of optical signals from said optical transmission device, for providing different optical weights to each of said plurality of signals;
   optical summing means, positioned for summing the plurality of weighted optical signals, for producing an output optical signal having an amplitude representing a combination of said plurality of particular numerical values; and
   a pluality of lenses, wherein said optical transmission device, said weighting means and said summing means are positioned with respect to said lenses so as to have a fourier transform relationship between the front and back focal planes of the lenses.

4. An optical digital to analog conversion apparatus as recited in claim 1 wherein said optical transmission device comprises a plurality of individually controllable elements each having two density states for providing optical signals each representing one of a pair of binary values.

5. An optical digital to analog conversion apparatus as recited in claim 4 wherein an input number is provided to the apparatus by electrical connecting means as a plurality of binary electrical signals for controlling said individually controllable elements thereof, said elements formed as an electrically controllable light valve array means for providing an output comprising a plurality of optical signals, each representing a bit value of one of said binary electrical signals.

6. An optical digital to analog conversion apparatus as recited in claim 5 wherein said light valve array means is formed of a plurality of sets of individual elements for providing analog optical output signals representing a plurality of numbers, each number input to the optical transmission device in the form of a plurality of bit values.

7. An optical digital to analog conversion apparatus comprising:
   controllable density optical transmission device having multiple defined density states for transmission of coherent optical radiation therethrough as a plurality of optical signals having particular intensities for representing a plurality of particular numerical values inputted thereto;
   optical weighting means, positioned for receiving the plurality of optical signals from said optical transmission device, for providing different optical weights to each of said plurality of signals;

optical summing means, positioned for summing the plurality of weighted optical signals, for producing an output optical signals having an amplitude representing a combination of said plurality of particular numerical values; and phase shifting means positioned adjacent said optical transmission device for providing different phases to different ones of said plurality of optical signals.

8. An optical digital to analog conversion apparatus as recited in claim 7 wherein said phase shifting means includes first means for phase shifting one of said plurality of optical signals for representing negative numbers.

9. An optical digital to analog conversion apparatus as recited in claim 8 wherein said phase shifting means includes second means for phase shifting a second of said plurality of optical signals for representing imaginary components of said numerical values represented by said optical signals.

10. An optical digital to analog conversion apparatus as recited in claim 9 wherein said optical transmission device includes a plurality of individual elements receiving optical radiation substantially simultaneously, each element having two density states for providing optical signals for representing bit values of an input number provided as weighted binary electrical signals, said plurality of individual elements including a first set of elements for representing a set of bits forming a real component and a second set of elements for representing a set of bits forming an imaginary component of said number.

11. An optical digital to analog conversion apparatus as recited in claim 10 wherein said plurality of individual elements are arranged in a plurality of groups for providing optical signals representing a plurality of numbers, each number represented in the form of a plurality of bit values.

12. An optical digital to analog conversion apparatus as recited in claim 7 wherein said phase shifting means includes said optical weighting means, said summing means comprising a diffraction grating for replicating and superimposing weighted outputs of said phase shifting means.

13. An optical digital to analog conversion apparatus as recited in claim 7 wherein said optical weighting means and said summing means are combined in a filter means having a predetermined density variation.

14. An optical digital to analog conversion apparatus as recited in claim 13 wherein said filter means includes a density variation described by a transmittance function F $$F = \text{rep}_{1/d}\left[\frac{2\alpha}{\alpha^2 + 4\pi^2 (Xd)^2}\right]$$

where X is a distance coordinate and 1/d represents the period of the rep function.

15. An optical digital to analog conversion apparatus as recited in claim 13 wherein said optical transmission device and said phase shifting means are located a focal length from a first lens for receiving incoming coherent optical radiation;

said filter means is located a focal length from and at an opposite side of said first lens, and a focal length from a second lens; and further comprising a masking means located a focal length from and at an opposite side of said second lens.

16. Optical digital-to-analog conversion apparatus comprising:

controllable density optical transmission device having multiple defined density states for transmission of coherent optical radiation therethrough as a plurality of optical signals having particular intensities for representing a plurality of particular numerical values inputted thereto;

optical weighting means, positioned for receiving the plurality of optical signals from said optical transmission device, for providing different optical weights to each of said plurality of signals;

optical summing means, positioned for replicating and superimposing the plurality of weighted optical signals at an output plane of the apparatus, for producing at said output plane an output optical signal having an amplitude representing a combination of said plurality of particular numerical values, wherein said optical weighting means and said summing means are combined in a filter means having a predetermined density variation;

a first lens means which is disposed between said optical transmission device and said filter means so as to provide a Fourier transform relationship between said optical transmission device and said filter means; and a second lens means which is disposed between said filter means and said output plane so as to provide a Fourier transform relationship between said filter means and said output plane.

17. Optical digital-to-analog conversion apparatus comprising:

controllable density optical transmission device having multiple defined density states for transmission of coherent optical radiation therethrough as a plurality of optical signals having particular intensities for representing a plurality of particular numerical values inputted thereto;

optical weighting means, positioned adjacent said optical transmission device, for providing different optical weights to each of said plurality of signals;

optical summing means, including a diffraction grating for replicating and superimposing the plurality of weighted optical signals at an output plane of the apparatus, for producing at said output plane an output optical signal having an amplitude representing a combination of said plurality of particular numerical values;

a first lens means which is disposed between said optical transmission device and said diffraction grating so as to provide a Fourier transform relationship between said optical transmission device and said diffraction grating; and a second lens means which is disposed between said diffraction grating and said output plane so as to provide a Fourier transform relationship between said diffraction grating and said output plane.

* * * * *